United States Patent
Zhang et al.

(10) Patent No.: US 10,520,919 B2
(45) Date of Patent: Dec. 31, 2019

(54) SYSTEMS AND METHODS FOR RECEIVING SENSOR DATA FOR AN OPERATING ADDITIVE MANUFACTURING MACHINE AND MAPPING THE SENSOR DATA WITH PROCESS DATA WHICH CONTROLS THE OPERATION OF THE MACHINE

(71) Applicant: General Electric Company, Schenectady, NY (US)

(72) Inventors: Li Zhang, Niskayuna, NY (US); Jacob Berlier, Niskayuna, NY (US); Adam McCann, Niskayuna, NY (US); Brandon Good, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 74 days.

(21) Appl. No.: 15/583,243

(22) Filed: May 1, 2017

(65) Prior Publication Data
US 2018/0314234 A1    Nov. 1, 2018

(51) Int. Cl.
*G05B 19/4099* (2006.01)
*B33Y 50/02* (2015.01)
(Continued)

(52) U.S. Cl.
CPC ........ *G05B 19/4099* (2013.01); *B23K 26/034* (2013.01); *B23K 26/042* (2015.10);
(Continued)

(58) Field of Classification Search
CPC .............. G05B 19/4099; B23K 26/034; B23K 26/342; B23K 26/042; G06F 17/50; B33Y 50/02
See application file for complete search history.

(56) References Cited

U.S. PATENT DOCUMENTS

2007/0017607 A1*  1/2007  Czerner .............. F27D 99/0001
                                                148/565
2009/0062930 A1*  3/2009  Aureli ............... H04L 29/08846
                                                700/7
(Continued)

FOREIGN PATENT DOCUMENTS

WO    2015134724 A1    9/2015
WO    2016065493 A1    5/2016

OTHER PUBLICATIONS

Alexopoulos, Kosmas et al., "Towards a role-centric and context-aware information distribution system for manufacturing", 8th International Conference on Digital Enterprise Technology, DET 2014, Science Direct, 8 pp.
(Continued)

*Primary Examiner* — Christopher E. Everett
(74) *Attorney, Agent, or Firm* — Buckley, Maschoff & Talwalkar, LLC

(57) ABSTRACT

Method, and corresponding system, for receiving and processing sensor data for an additive manufacturing machine. The method includes determining values of the sensor data relative to time; and determining tool positions relative to time based on process data which controls operation of the additive manufacturing machine. The method further includes determining the sensor data values at the working tool positions based on a correlation of the values of the sensor data relative to time and the working tool positions relative to time. A representation of the sensor data values at the working tool positions is displayed by a user interface device.

21 Claims, 7 Drawing Sheets

(51) Int. Cl.
  *G06F 17/50* (2006.01)
  *B23K 26/042* (2014.01)
  *B23K 26/03* (2006.01)
  *B23K 26/342* (2014.01)
(52) U.S. Cl.
  CPC ............ *B23K 26/342* (2015.10); *B33Y 50/02* (2014.12); *G06F 17/50* (2013.01)

(56) References Cited

U.S. PATENT DOCUMENTS

| | | | | |
|---|---|---|---|---|
| 2010/0189135 A1* | 7/2010 | Garneau | ............... | H04J 3/0661 370/498 |
| 2010/0313646 A1* | 12/2010 | Mehta | ................... | E21B 47/00 73/152.54 |
| 2011/0184711 A1* | 7/2011 | Altman | ................ | E21B 49/005 703/10 |
| 2011/0316978 A1* | 12/2011 | Dillon | ................ | G01B 11/2509 348/46 |
| 2013/0103348 A1 | 4/2013 | Cao et al. | | |
| 2013/0282345 A1 | 10/2013 | McCulloch et al. | | |
| 2013/0332113 A1 | 12/2013 | Piemonte et al. | | |
| 2014/0348154 A1* | 11/2014 | Hofman | .................. | G01D 9/00 370/350 |
| 2015/0162000 A1 | 6/2015 | Di Censo et al. | | |
| 2015/0165681 A1* | 6/2015 | Fish | ...................... | B22F 3/1055 264/40.6 |
| 2015/0273861 A1* | 10/2015 | Setoue | .................... | B41J 2/442 347/232 |
| 2015/0348432 A1 | 12/2015 | Moghaddam et al. | | |
| 2016/0177481 A1* | 6/2016 | Wolf | ...................... | D03D 49/62 700/140 |
| 2017/0045493 A1* | 2/2017 | van der Woude | .... | B66B 7/1215 |
| 2017/0080960 A1* | 3/2017 | Moeller | ................ | B61L 23/047 |
| 2017/0348900 A1* | 12/2017 | Williams | ............. | G03F 7/70416 |
| 2018/0246321 A1* | 8/2018 | Campton | ............... | B22F 3/1055 |
| 2018/0370144 A1* | 12/2018 | Revanur | ................ | B29C 64/393 |

OTHER PUBLICATIONS

Imtiaz, Jahanzaib et al., "A Flexible Context-Aware Assistance System for Industrial Applications Using Camera based Localization", IEEE Emerging Technology and Factory Automation, Sep. 16-19, 2014, 4 pp.

Alexopoulos, Kosmas et al., "A concept for Context-Aware Computing in Manufacturing: The White Goods Case", International Journal of Computer Integrated Manufacturing, vol. 29, No. 8, Jul. 11, 2015, 11 pp.

* cited by examiner

SYSTEMS AND METHODS FOR RECEIVING SENSOR DATA FOR AN OPERATING ADDITIVE MANUFACTURING MACHINE AND MAPPING THE SENSOR DATA WITH PROCESS DATA WHICH CONTROLS THE OPERATION OF THE MACHINE

FIELD OF THE INVENTION

Exemplary embodiments described herein relate to receiving sensor data for an operating additive manufacturing machine and mapping the sensor data with process data which controls the operation of the manufacturing machine.

BACKGROUND

The term "additive manufacturing" refers to processes used to synthesize three-dimensional objects in which successive layers of material are formed by a manufacturing machine under computer control to create an object using digital model data from a 3D model. One example of additive manufacturing is direct metal laser sintering (DMLS), which uses a laser fired into a bed of powdered metal, with the laser being aimed automatically at points in space defined by a 3D model, thereby melting the material together to create a solid structure. The term "direct metal laser melting" (DMLM) may more accurately reflect the nature of this process since it typically achieves a fully developed, homogenous melt pool and fully dense bulk upon solidification. The nature of the rapid, localized heating and cooling of the melted material enables near-forged material properties, after any necessary heat treatment is applied.

The DMLS process uses a 3D computer-aided design (CAD) model of the object to be manufactured, whereby a CAD model data file is created and sent to the fabrication facility. A technician may work with the 3D model to properly orient the geometry for part building and may add supporting structures to the design, as necessary. Once this "build file" has been completed, it is "sliced" into layers of the proper thickness for the particular DMLS fabrication machine and downloaded to the machine to allow the build to begin. The DMLS machine uses, e.g., a 200 W Yb-fiber optic laser. Inside the build chamber area, there is a material dispensing platform and a build platform along with a recoater blade used to move new powder over the build platform. The metal powder is fused into a solid part by melting it locally using the focused laser beam. In this manner, parts are built up additively layer by layer—typically using layers 20 micrometers thick. This process allows for highly complex geometries to be created directly from the 3D CAD data, automatically and without any tooling. DMLS produces parts with high accuracy and detail resolution, good surface quality, and excellent mechanical properties.

Defects, such as subsurface porosity, can occur in DMLM processes due to various machine, programming, environment, and process parameters. For example, deficiencies in machine calibration of mirror positions and laser focus can result in bulk-fill laser passes not intersecting edge-outline passes. Such deficiencies can result in unfused powder near the surface of the component, which may break through the surface to cause defects which cannot be healed by heat treatment finishing processes. Another subsurface effect of deficiencies in calibration and machine programming is excessive dwelling at the turnaround points in raster scanning. Such dwell can result in excessive laser time (i.e., laser focus time) on a given volume, which may result in "keyholing" and subsurface porosity. Laser and optics degradation, filtration, and other typical laser welding effects can also significantly impact process quality, particularly when operating for dozens or hundreds of hours per build. Furthermore, the DMLM process has thermal shrink and distortion effects which may require CAD model corrections to bring part dimensions within tolerance.

To reduce such defects, process models could be used to predict local geometric thermal cycles during the DMLM process, thereby predicting material structure (e.g., grain) and material properties. Models could also be used to predict shrink and distortion, which would enable virtual iteration prior to the actual DMLM process. Furthermore, predictive models could be used to generate a compensated DMLM model to drive the manufacturing machine while accounting for such shrinkage and distortion.

Conventional models relating build parameters to expected melt pool characteristics can be incomplete and/or inaccurate because of shortcomings in the collection and use of data from sensors monitoring the manufacturing process. Many of these shortcomings arise because conventional manufacturing sensor configurations produce "context-less" data, i.e., data which does not have a frame of reference other than time of measurement.

Consequently, captured manufacturing sensor data is not in a useful context for design teams to analyze. Another shortcoming of conventional manufacturing sensor configurations is that the sensors monitoring a DMLM process may produce unmanageable quantities of data. For example, a pyrometer monitoring a build may have a data acquisition rate of 50 kHz, which means that a tremendous quantity of data is produced over a long build, e.g., 30 hours.

SUMMARY

Disclosed embodiments provide context-aware data which can lead to meaningful analytics of manufacturing processes which, in turn, can provide insights into design changes to improve such processes. Disclosed embodiments contextualize sensor data by linking it to manufacturing data during the build process. This contextual linkage informs the development and refinement of "digital twin" models and analytics to provide insights back to design and engineering to complete the physical-digital feedback loop. Manufacturing and sensor data which are "contextualized" in this manner result in higher fidelity digital twin models for parts.

Disclosed embodiments allow for consistent build quality and anomaly detection in DMLM printing through control and diagnostics of melt pool characteristics. Data may be tagged by geometry so that melt pool characteristics can be viewed and queried according to layer and scanning pattern. A "part genealogy" may be provided so that environmental conditions are captured when depositing an individual layer. The knowledge of experienced operators, who may engage in "rounding" by sense of look, listen, and smell, may be effectively captured and digitized. Support may be provided for "debugging" tools to analyze production failures in real-time. A benchmark standard may be provided to allow part-to-part, build-to-build, and machine-to-machine comparison so that build and design tools are no longer in separate "silos." In-process analysis tools may be provided to avoid relying solely on post-build tools.

Disclosed embodiments enable design of experiment (DoE) based on contextualized data to improve product quality (e.g., part life, finish, etc.) and reproducibility. Insights may be developed regarding how parts are built to inform future design and modeling processes for computer-aided design and manufacturing (CAD/CAM). Such informed process changes help to optimize production effectiveness and reduce cost. Also, key machine performance characteristics may be captured to achieve individualized CAM.

In one aspect, the disclosed embodiments provide a method, and corresponding system, for receiving and processing sensor data for an operating additive manufacturing machine. The method includes receiving, at a first server, the sensor data from a sensor for the additive machine. The method further includes determining, using a processor of the first server, values of the sensor data relative to time; and determining, using the processor of the first server, tool positions relative to time based on process data which controls operation of the manufacturing machine. The process data includes working vectors defining the working tool positions during an additive manufacturing process. The method further includes determining the sensor data values at the working tool positions based on a correlation of the values of the sensor data relative to time and the working tool positions relative to time; and displaying, on a display of the user interface device, a representation of the sensor data values at the working tool positions.

In disclosed embodiments, the method may include one or more of the following features.

The method may further include correlating, using a processor of a user interface device, a structural model of the part with the sensor data values at the working tool positions, such that the displaying includes displaying at least a portion of the structural model in correspondence with the representation of the sensor data values at the working tool positions.

The method may include segmenting, using the processor of the first server, the process data into working vectors and non-working vectors; and filtering, based on the working vectors, the tool positions relative to time to obtain the working tool positions relative to time. The correlating of the structural model may include correlating each of the working tool positions of the sensor data values with a closest element of the structural model. The displaying of the structural model may include setting a color of each correlated element of the structural model in accordance with a determined color code to visually represent the respective sensor data value. The correlating of the structural model with the sensor data values may include aligning the structural model with a point cloud formed by the sensor data values relative to the working tool positions. The display of the structural model may include: assigning a color to each point of the point cloud in accordance with a determined color code to visually represent the respective sensor data value; and displaying the point cloud superimposed on the structural model.

The process data may be arranged in layers, and the displaying of the structural model in correspondence with the representation of the sensor data values at the working tool positions may be done on a layer-by-layer basis. The receiving of the sensor data may include sampling an output of the sensor to produce the sensor data. The tool may include a laser and the sensor may include a pyrometer configured to detect a surface temperature of the part at a point where a beam of the laser is impinging on the part.

BRIEF DESCRIPTION OF THE DRAWINGS

Features and advantages of the exemplary embodiments, and the manner in which the same are accomplished, will become more readily apparent with reference to the following detailed description taken in conjunction with the accompanying drawings.

DETAILED DESCRIPTION

Figure 1:
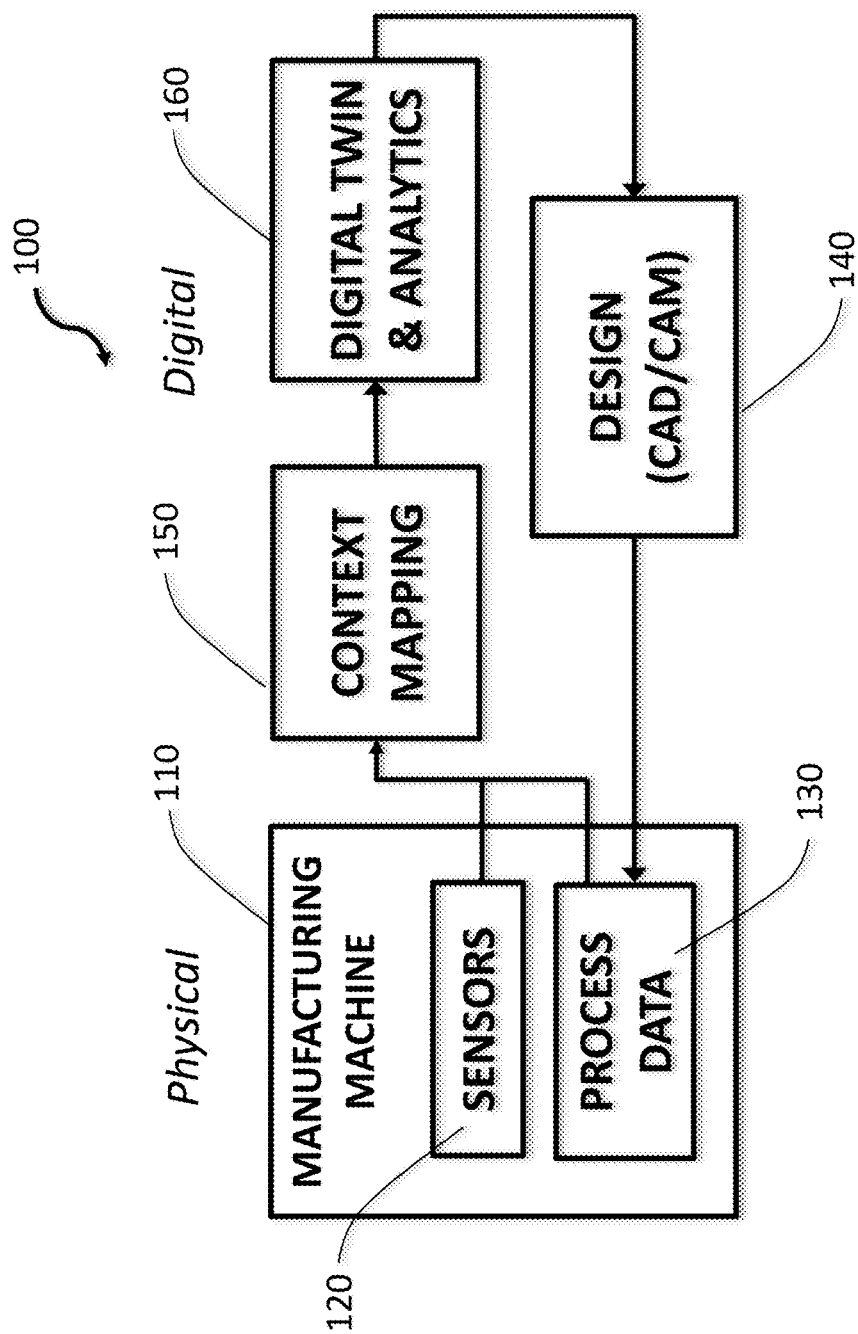
FIG. 1 is a block diagram of an embodiment of a system for receiving sensor data for an additive manufacturing machine and mapping the sensor data with process data which controls the operation of the machine.

FIG. 1 depicts a system 100 for receiving sensor data for an additive manufacturing machine 110 (e.g., sensor output which is sampled and digitized) and mapping the sensor data 120 with process data 130 which controls the operation of the manufacturing machine 110. The manufacturing machine 110 is computer controlled, e.g., by an internal processor having associated software which interacts with the various components of the machine 110. The software includes process data 130 which provides instructions for the machine 110 to fabricate a particular part. Such instructions may, for example, control the position, movement, and power setting of a laser in an additive manufacturing machine. The process data 130, in such a case, defines a path for the laser for each layer of a part. The process data 130 can be changed, as necessary, to modify the manufacturing process to refine the physical characteristics of a manufactured part or to produce a different part. In a typical case, the process data 130 is downloaded from a design facility 140, e.g., a computer-aided design and computer aided manufacturing (CAD/CAM) facility, and stored on the manufacturing machine 110.

The manufacturing machine 110 has a number of sensors 120 which monitor various aspects of the manufacturing process. These may include sensors 120 which measure the physical characteristics of a part being manufactured or worked on by the machine 110, such as, for example, temperature, pressure, acceleration, etc. It may also be desirable to have sensors 120 which are separately installed in or near the machine 110 to measure additional physical characteristics, e.g., a pyrometer to measure temperature during operation of an additive manufacturing machine. Typically, the sensors 120 continuously output data during the manufacturing cycle, e.g., build time, of a part. For purposes of discussion, the native sensors of the machine, as well as any separately installed sensors 120 which are monitoring the machine 110 (and/or the part being manufactured by the machine), are considered to result in "sensor data for the machine." In disclosed embodiments, the sensor data 120 may come directly from the machine 110 and also may come from separately installed sensors 120 (in which case the sensor output is sampled and digitized to produce the sensor data).

In disclosed embodiments, a context mapping 150 of the sensor data 120 is performed which correlates the sensor data 120 with the process data 130. In the resulting contextualized data, the various sensor 120 readings are associated with the instructions in the process data 130 based on a time correlation. Thus, for example, a sensor output measuring acceleration of the laser of an additive manufacturing machine can be aligned with specific directional and velocity instructions for the laser in the process data. This allows engineering and design teams to analyze data in the context of what was happening in the manufacturing process, rather than merely in the context of when the sensor measurement was taken. Therefore, for example, changes can be made to the laser instructions to change the laser path to reduce acceleration below a desired threshold.

In disclosed embodiments, the system 100 may be used to provide models in association with a machine learning framework, for example, a "digital twin" 160 of a twinned physical system (e.g., the manufacturing machine 110). A digital twin 160 may be a high fidelity, digital replica or dynamic model of an asset (e.g., an additive manufacturing machine) or process, used to continuously gather data and increase insights, thereby helping to manage industrial assets at scale. A digital twin 160 may leverage contextual data from the sensors 120 to represent near real-time status and operational conditions of an asset (e.g., the manufacturing machine 110) or process. A digital twin may estimate a remaining useful life of a twinned physical system using sensors, communications, modeling, history, and computation. It may provide an answer in a time frame that is useful, i.e., meaningfully prior to a projected occurrence of a failure event or suboptimal operation. It might comprise a code object with parameters and dimensions of its physical twin's parameters and dimensions that provide measured values, and keeps the values of those parameters and dimensions current by receiving and updating values via contextual data from the sensors associated with the physical twin. The digital twin may comprise a real time efficiency and life consumption state estimation device. It may comprise a specific, or "per asset," portfolio of system models and asset-specific sensors. It may receive inspection and/or operational data and track a single specific asset over its lifetime with observed data and calculated state changes. Some digital twin models may include a functional or mathematical form that is the same for like asset systems, but will have tracked parameters and state variables that are specific to each individual asset system. The sophisticated insights gained from analysis of contextual data and use of a digital twin 160 can be passed on to design and engineering elements 140 to allow for design changes to improve the part or the manufacturing process (e.g., the efficiency of the process).

Figure 2:
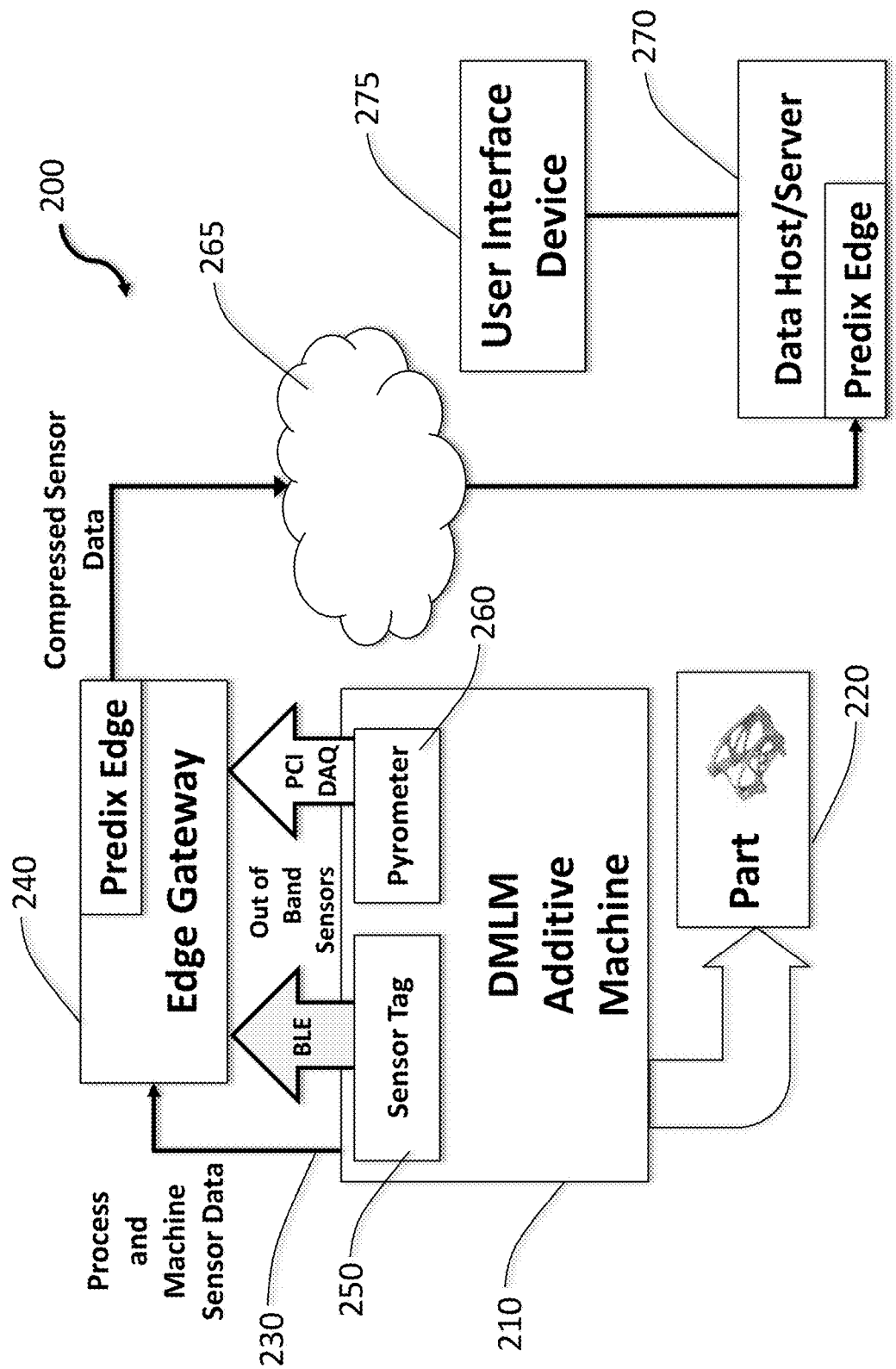
FIG. 2 is a block diagram of an embodiment of a system for receiving sensor data for a direct metal laser melting (DMLM) additive manufacturing machine and mapping the sensor data with process data.

FIG. 2 depicts an embodiment of a system 200 for receiving sensor data for a direct metal laser melting (DMLM) additive manufacturing machine 210 (including sensor output from separately installed sensors, which is sampled and digitized) and mapping the sensor data with the process data. The operation of the machine 210 as it fabricates a part 220 is monitored by internal sensors of the machine, such as, for example, acceleration of the laser, humidity, and ambient temperature. The output of these sensors may be communicated through the control and monitoring channels 230 of the machine to a network computing and communication device, such as, for example, an edge gateway server 240. Additional sensors may be installed at the DMLM machine 210 to provide measurement data for parameters not measured by the native sensors of the machine 210. For example, a sensor tag 250 attached to and/or associated with the part being manufactured may provide data wirelessly, e.g., a tag which measures the presence of particular gasses. As a further example, a pyrometer 260 may be installed at the manufacturing machine 210 to measure surface temperatures on a part 220 being manufactured, which may serve as a measure of laser intensity. The output from these additional sensors may be transmitted via separate channels (i.e., "out of band") relative to the native sensors of the manufacturing machine, e.g., the sensor tag 250 data may be transmitted via a direct Bluetooth low energy (BLE) connection to the edge gateway and the pyrometer 260 data may be transmitted via a direct peripheral component interconnect bus data acquisition (PCI DAQ).

As discussed in further detail below, the edge gateway 240 may receive sensor output data from one or more manufacturing machines 210 and performs a context mapping (see, e.g., FIG. 1) with the process data which is used to control the one or more machines 210. The process data for each machine 210 may be sent to the edge gateway via a control and monitoring channel 230, i.e., the conventional data communication channel of the machine. Alternatively, the process data for a particular machine may be transmitted from another source, e.g., a design and engineering facility, in advance of the operation of the machine and stored in a memory of the edge gateway. In addition to the context mapping of the sensor output data, the edge gateway 240 filters and/or compresses the sensor data before transmitting it, thereby reducing the large amount of sensor data into a data set that can be practically transmitted via a network 265 (e.g., the internet or another cloud-based network).

The compressed, filtered data is received via the network 265 at a data host/server 270. Both the edge gateway 240 and the data host/server 270 may communicate using Predix™ which has been developed by General Electric to provide cloud computing tools and techniques that provide application management and facilitate communication with industrial machines in distributed locations. In such a case, the edge gateway 240 and the data host/server 270 are equipped with an implementation of Predix Edge, which enables these devices to communicate readily via the cloud-based network 265. The data host/server 270 performs various data storage and management functions. It is connected to a user interface device 275, such as, for example, a computer with a display and input devices. The user interface device 275 provides various ways of displaying and analyzing the data from the data host/server 270.

Figure 3:
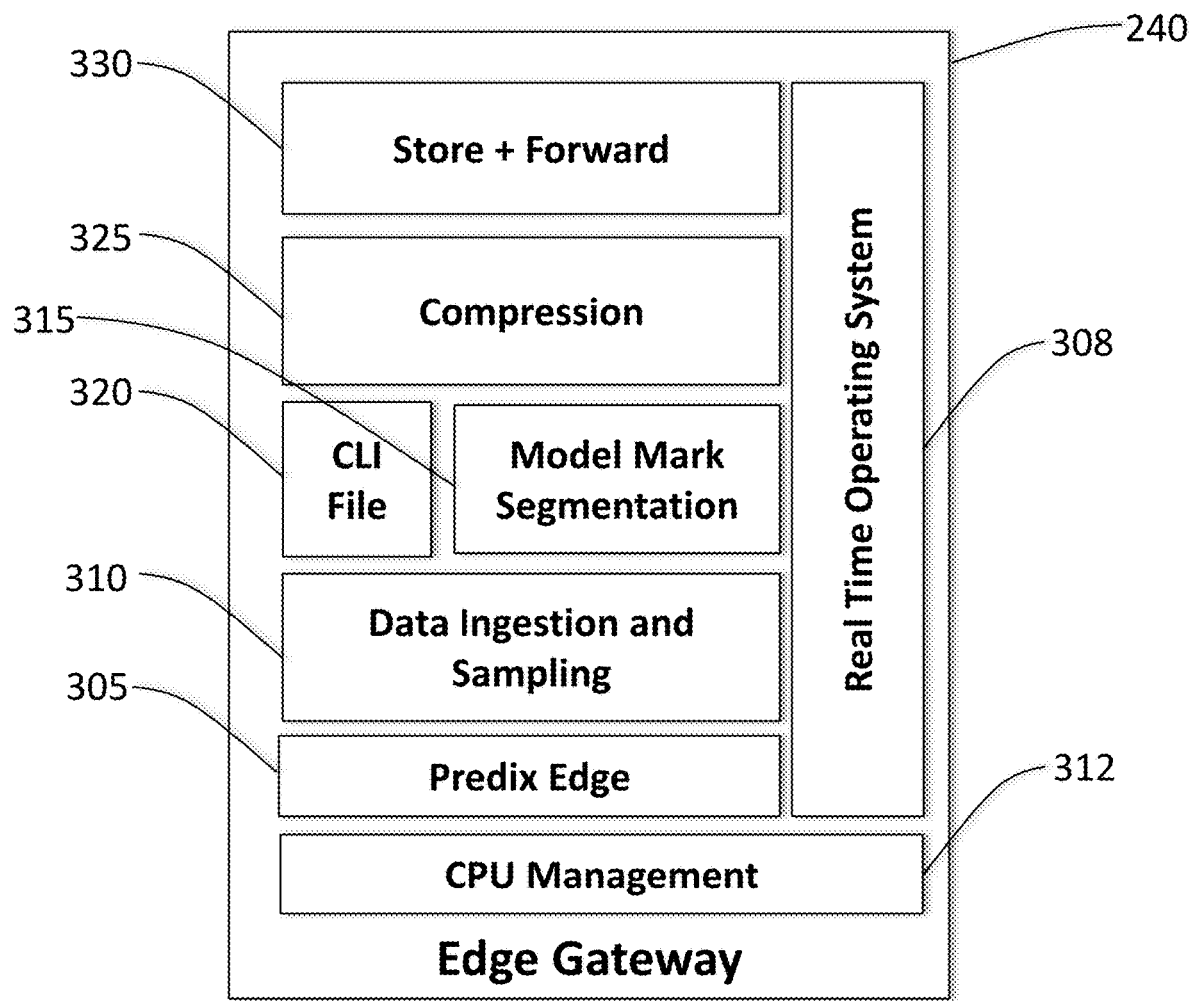
FIG. 3 is a block diagram of an embodiment of an edge gateway for receiving sensor data for a DMLM machine.

FIG. 3 depicts an embodiment of an edge gateway 240 for receiving sensor data for a DMLM machine 210 (see FIG. 2), including sensor output from separately installed sensors, which may be sampled and digitized. Each box represents an app (i.e., software application) which performs particular functions relating to the receiving and processing of sensor data. The boxes defined in this figure represent an embodiment of the edge gateway 240 in which the functions performed by the edge gateway 240 are divided among a specific combination of apps. Other embodiments of the edge gateway 240 may perform similar functions but may divide the functions among a different combination of apps (e.g., a combination in which the functions of two separate apps have been combined into a single app, or vice versa). The apps run on a conventional computer operating system, e.g., Microsoft Windows™ or Linux.

The edge gateway 240 receives data from native sensors of the manufacturing machine 210 via the network 230 communication channels which are used for control and monitoring of the machine (see FIG. 2). Such communications may be handled by an implementation of Predix Edge 305 in the edge gateway 240. In addition, there may be a data ingestion and sampling app 310 configured to receive out-of-band communications from additional sensors installed at the machine, such as, for example, a pyrometer. Prior to the data ingestion and sampling app 310, the receiving of the out-of-band communications may be handled by a real-time operating system (RTOS) 308 which is configured to handle the data as it is received in real time. In disclosed embodiments, an RTOS or a field programmable gate array (FPGA) is used to perform raw data acquisition operations in deterministic time before the apps (e.g., the data ingestion and sampling app 310) process the data. For example, some laser systems produce a digital trigger signal that is captured in sync with pyrometry data to provide microsecond accuracy the on/off times of the laser. The data ingestion and sampling app 310 may use specialized adapters to receive the out-of-band data and may provide signal conditioning, sampling at one or more specific rates (e.g., 50 kHz), and analog to digital conversion. The specialized adapters may include an adapter configured to receive Bluetooth low energy (BLE) signals from sensor tags. The edge gateway 240 also may include a central processing unit (CPU) management app 312 to control the use of multiple CPU cores to perform processing tasks more efficiently.

As noted above, the sensor data received from the pyrometer may be considered to be a measurement of laser intensity. To provide context for the intensity data, the edge gateway 240 maps the intensity data with the position of the laser obtained from process data, taking into account whether the laser is on or off at each position. To perform the mapping, the model mark segmentation app 315 maps the intensity data versus time. The process data relating to laser position and activation is stored in a common layer interface (CLI) file 320 in the form of laser scanning and movement (i.e., "jump") vectors arranged in layers—the laser being on during a scanning vector and off during a jump vector. The CLI file 320 is processed by the model mark segmentation app 315 to produce the position of the laser versus time while the laser is turned on for each layer of the part. The model mark segmentation app 315 correlates intensity and position of the laser to produce a data set for intensity versus position (while the laser is on). The mapped, i.e., correlated, data from the model mark segmentation app 315 is output to a compression app 325 to reduce data transmission requirements and is then sent to a store and forward app 330 where the data is stored in a buffer and forwarded for transmission via the network.

Figure 4:
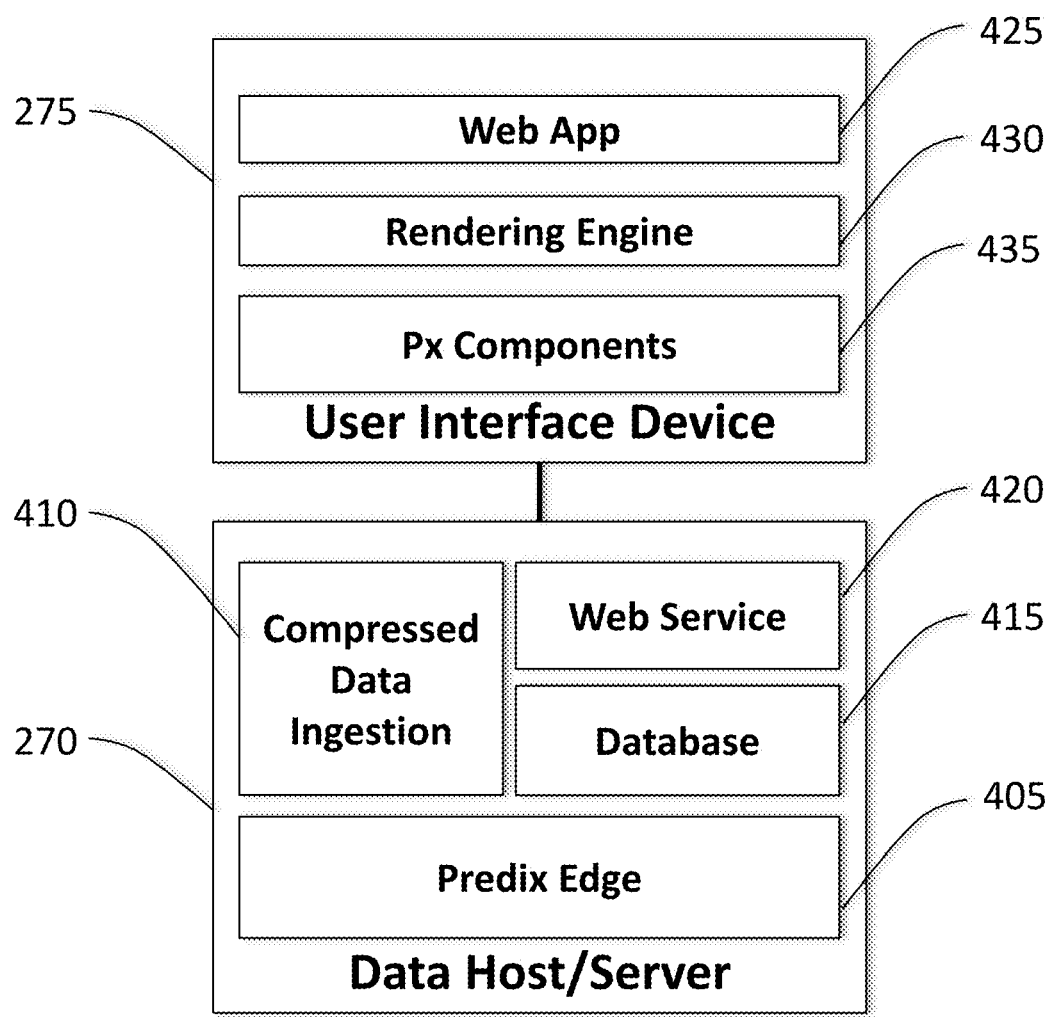
FIG. 4 is a block diagram of an embodiment of a data host/server and user interface device.

FIG. 4 depicts an embodiment of a data host/server 270 and user interface device 275 for receiving and analyzing sensor data from the edge gateway 240, which is connected to the DMLM machine 210 (see FIGS. 2 and 3). The sensor data may be, for example, laser intensity data based on pyrometer measurements. The data host/server 270 is connected via a network 265 to the edge gateway 240 (see FIG. 2) and may use Predix Edge 405 to facilitate communication and also to manage the apps running on the data host/server. The compressed laser intensity data transmitted by the edge gateway 240 (see FIG. 2) is received at the data host/server 270 by a compressed data ingestion app 410, where it is stored in a database 415. In disclosed embodiments, the ingested data is stored in correspondence with formation layers of the part being manufactured by the additive manufacturing machine. In such a case, the formation layers of the part may have an identifying number which allows data to be stored and retrieved based on a layer number. This allows a user to retrieve a set of laser intensity data for all (x, y) positions in a particular layer in its compressed form. The data is made available by the data host/server 270 via a web service 420 which is accessible by one or more user interface devices through a protocol such as, for example, representational state transfer (REST).

The user interface device 275 provides a web app 425 which accesses the web service 420 of the data host/server 270 to retrieve stored sensor data. The web app 425 may run as a standalone application on the native operating system of the user interface device 275 or it may be accessed via a browser running on the user interface device 275. Through the web app 425, the user may request data from the web service 420, e.g., data for a specific layer, in which case the relevant data is retrieved from the database 415 by the web service 420 and transmitted to the web app 425 on the user interface device 275. In disclosed embodiments, the data for the layer is decompressed by the user interface device 275, rather than by the data host/server 270. The decompression may be performed by the rendering engine 430 (discussed below) or a separate app/module running on the user interface device 275. This configuration allows the data to be sent from the data host/server 270 to a number of user interface devices 275 in compressed form, thereby reducing data communication requirements.

A rendering engine 430 is used to display the data in various formats, such as, for example, a three-dimensional perspective view. The rendering engine 430 may also color code the data so that the sensor data can be more easily visualized. For example, higher levels of laser intensity may be presented in red. The color coding may be applied by the rendering engine 430 to elements of a structural model, e.g., a 3D CAD model, of the manufactured part. The 3D model of the part may be stored, e.g., in a 3D CAD stereolithography (STL) file. The user interface device 275 may include Predix components 435 to facilitate the presentation of a graphical user interface.

Figure 5:
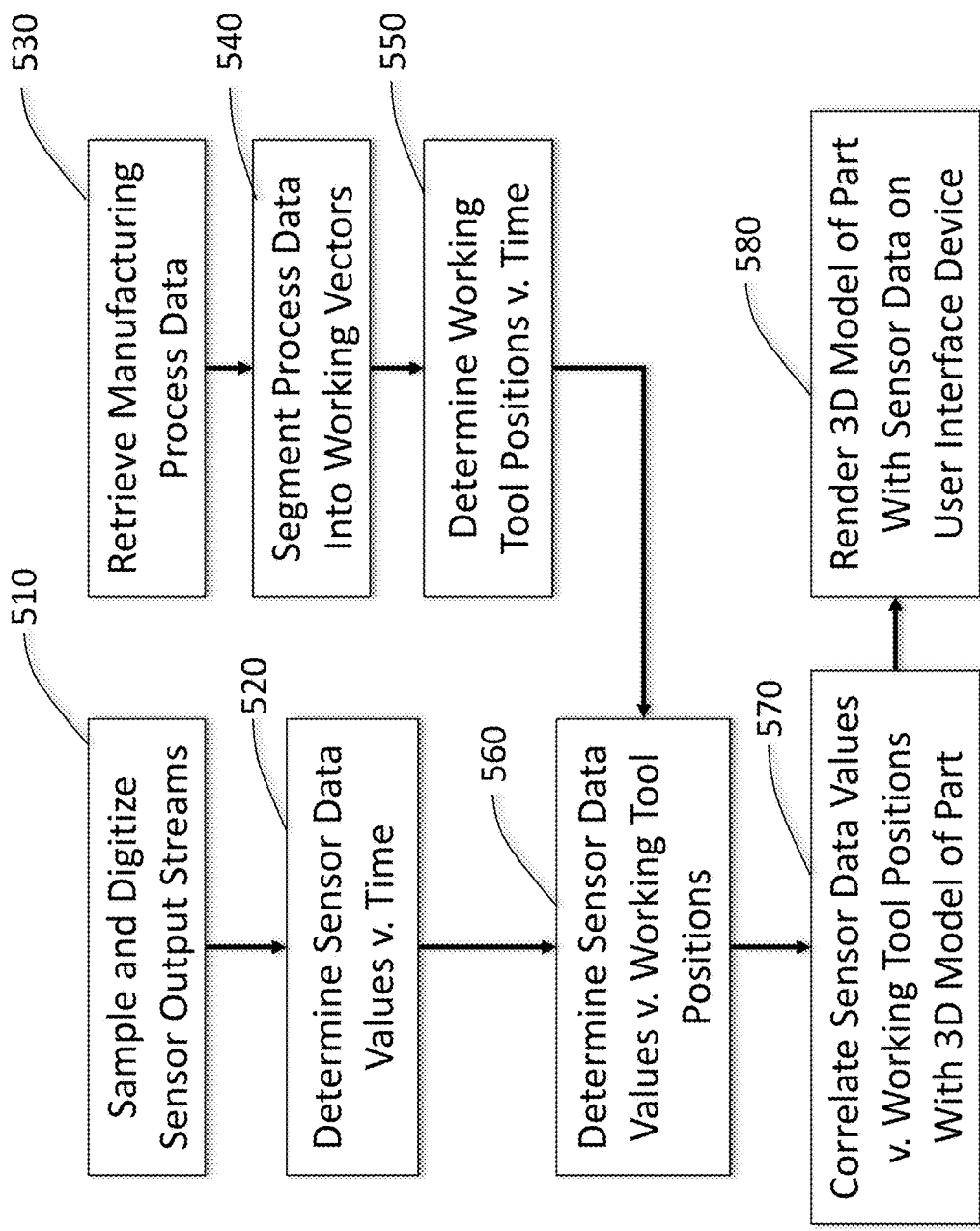
FIG. 5 is a flowchart of an embodiment of a process for mapping the sensor data with process data and rendering the result for display on the user interface device.

FIG. 5 depicts an embodiment of a process for mapping sensor data with process data and rendering the result for display on a user interface device. A sensor output stream, e.g., from a pyrometer, is sampled at a determined frequency (e.g., 50 kHz) and digitized 510. This results in a stream of sensor data values at a known frequency. Therefore, each sensor data value can be associated with a specific time relative to a determined time reference 520. Manufacturing process data is retrieved to obtain information regarding the path of the tool (e.g., a laser) during manufacture of the part 530. The process data may be in the form of a CLI file, which specifies parameters relating to movement of the tool, such as the tool path (e.g., specified by position coordinate vectors and layer number), tool velocity, etc. The timing of the position of the tool can be computed based on these movement parameters. The data in the CLI file also controls when the tool is on, i.e., scanning or working, versus when it is merely moving from one position to another. A vector which specifies movement while the tool is on may be referred to as a "working vector". The CLI file is segmented, i.e., divided, to separate the working vectors from the non-working vectors on each layer 540. This allows determination of the "working tool position" versus time for each layer, as both the position of the tool (while the tool is on) and the timing of its movement are known 550. The sensor data values versus time and the working tool positions versus time can be time correlated to produce sensor data values versus working tool position 560.

In disclosed embodiments, the time correlation is performed by aligning waveforms of the sensor data values versus time with the working tool positions versus time. Specifically, as the laser switches from an off condition in a non-working vector to an on condition in a subsequent working vector, and vice versa, these binary conditions produce a square wave characteristic. The activation of the laser in the working vectors results in a significant increase in the sensor data values from the pyrometer, followed by a sharp drop in the sensor data values when the laser is switched off in a subsequent non-working vector. Thus, the waveform of the sensor data values is substantially a square wave, except that there is a delay relative to the working vector, and some rounding of the waveform, due to a natural lag between laser activation/deactivation and the pyrometer readings. Nevertheless, the waveforms of the sensor data values can be aligned with corresponding working vectors to effectively achieve a time correlation therebetween. Alternatively, in disclosed embodiments, the time correlation may be performed by stepping through the time data points of the working tool positions versus time data, searching for a close time data point in the sensor data values versus time, and matching the corresponding sensor data value with the corresponding working tool position. Various other algorithms for correlating the data points with respect to time may be used.

The determination of sensor data values versus working tool position provides a space domain context in which to consider the sensor data values, i.e., the points in 3D space at which each sensor measurement was made. The sensor data values in their space domain context form a "point cloud" of sensor data values at specific points in space which, in turn, can be correlated to the physical structure of the manufactured part, e.g., by using a 3D model of the part 570. For example, measured laser intensities can be correlated with the point in 3D space at which they are measured, and this point can be mapped to a corresponding point or element on the surface of the manufactured part. In disclosed embodiments, the mapping is done on a layer-by-layer basis.

A 3D CAD model of the part may be used in the mapping of the measurement points of the sensor data values onto the physical structure of the part because process data files, e.g., CLI files, typically do not include information regarding the physical structure of the part. For example, an STL file may be used as the source of the 3D model of the part. The sensor data values in the point cloud can each be correlated, on a layer-by-layer basis, with the closest corresponding point/element of the 3D model (an STL file defines the physical structure as a shell rather than as a point cloud, so the correlation is not per se point-to-point). The corresponding elements of the 3D model can then be modified to indicate the corresponding sensor data value, e.g., by setting the element of the 3D model to a specific color based on a determined color code. The 3D model with a representation of the sensor data (e.g., represented by a color code) can be rendered, according to layer, on a display of the user interface device using conventional rendering techniques 580. Alternatively, the point cloud of sensor data values could be color coded and separately rendered superimposed on the 3D model on a layer-by-layer basis. In such a case, the point cloud of sensor data values for a particular layer may be aligned as a whole with the corresponding layer of the 3D model, rather than on a point-to-point basis, e.g., by alignment of designated reference points. The rendering and display of the 3D model and sensor data value point cloud is done on a layer-by-layer basis. In disclosed embodiments, the 3D model may be displayed as individual 2D models of each layer, e.g., by presenting a plan view of each layer.

Figure 6:
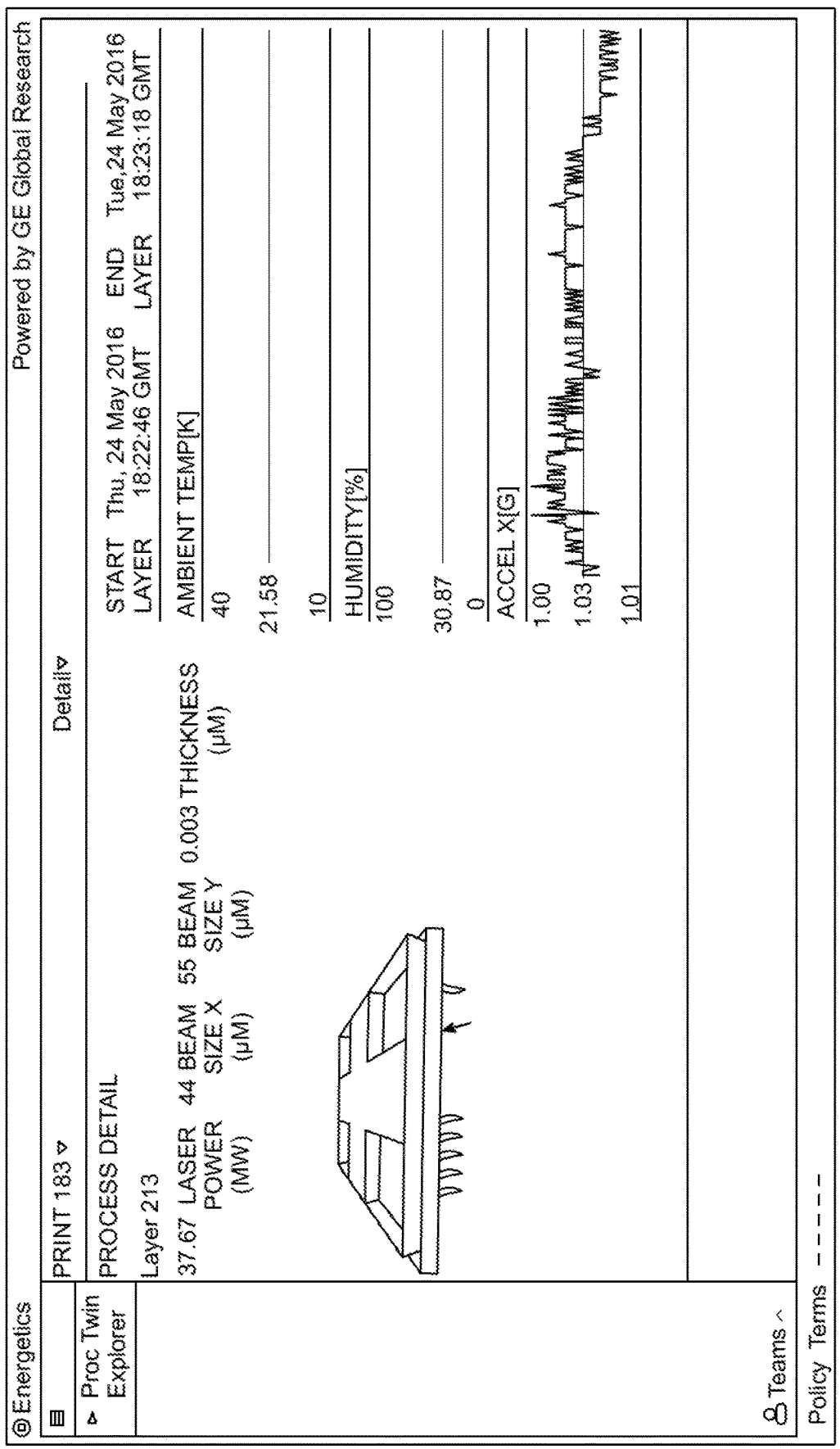
FIG. 6 depicts an example of a user interface screen displaying sensor data for a layer of a part manufactured by a selected machine.

FIG. 6 depicts an example of a user interface screen displaying sensor data for a part manufactured by a selected additive manufacturing machine. A particular machine can be selected by a user, e.g., by making a selection on a menu screen provided by the user interface web app. In disclosed embodiments, the user also selects a specific layer to view (which may be identified by number). The user interface displays an information screen which includes an image of the selected layer of the part, such as, for example, a perspective view of the top and the front edge of the selected layer. The user interface also may display a laser power level, laser beamsize specified for the layer in the process data file, as well as the layer thickness. In addition, the user interface may display, in graphical form, parameters which are subject to change over the course of scanning a layer, such as, for example, ambient temperature, humidity, and laser acceleration.

Figure 7:
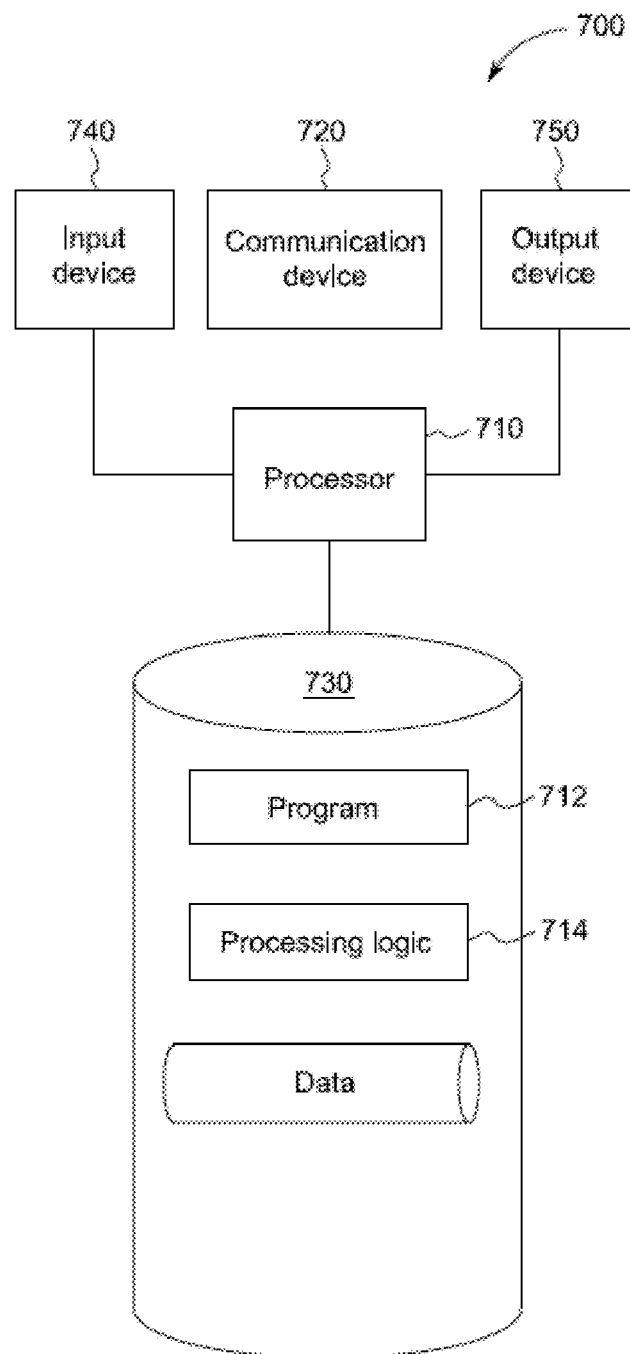
FIG. 7 depicts a processing platform for implementing embodiments described herein.

The embodiments described herein may be implemented using any number of different hardware configurations. For example, FIG. 7 illustrates a processing platform 700 that may be, for example, associated with components of the systems disclosed herein. The processing platform 700 comprises a processor 710, such as one or more commercially available central processing units (CPUs) in the form of one-chip microprocessors, coupled to a communication device 720 configured to communicate via a communication network (not shown). The communication device 720 may be used to communicate, for example, with one or more users. The processing platform 700 further includes an input device 740 (e.g., a mouse and/or keyboard to enter information) and an output device 750.

The processor 710 also communicates with a memory/storage device 730. The storage device 730 may comprise any appropriate information storage device, including combinations of magnetic storage devices (e.g., a hard disk drive), optical storage devices, mobile telephones, and/or semiconductor memory devices. The storage device 730 may store a program 712 and/or processing logic 714 for controlling the processor 710. The processor 710 performs instructions of the programs 712, 714, and thereby operates in accordance with any of the embodiments described herein. For example, the processor 710 may receive data and then may apply the instructions of the programs 712, 714 to carry out methods disclosed herein.

The programs 712, 714 may be stored in a compressed, uncompiled and/or encrypted format. The programs 712, 714 may furthermore include other program elements, such as an operating system, a database management system, and/or device drivers used by the processor 710 to interface with peripheral devices. Information may be received by or transmitted to, for example: (i) the platform 700 from another device; or (ii) a software application or module within the platform 700 from another software application, module, or any other source.

It is noted that aggregating data collected from or about multiple industrial assets (e.g., manufacturing machines) may enable users to improve operational performance. In an example, an industrial asset may be outfitted with one or more sensors configured to monitor respective ones of an asset's operations or conditions. Such sensors may also monitor the condition of a component part being processed, e.g., manufacturec, by the asset. Data from the one or more sensors may be recorded or transmitted to a cloud-based or other remote computing environment. By bringing such data into a cloud-based computing environment, new software applications informed by industrial process, tools and know-how may be constructed, and new physics-based analytics specific to an industrial environment may be created. Insights gained through analysis of such data may lead to enhanced asset designs, or to enhanced software algorithms for operating the same or similar asset at its edge, that is, at the extremes of its expected or available operating conditions. The data analysis also helps to develop better service and repair protocols and to improve manufacturing processes.

The systems and methods for managing industrial assets may include or may be a portion of an Industrial Internet of Things (IIoT). In an example, an IIoT connects industrial assets, such as turbines, jet engines, and locomotives, to the Internet or cloud, or to each other in some meaningful way. The systems and methods described herein may include using a "cloud" or remote or distributed computing resource or service. The cloud may be used to receive, relay, transmit, store, analyze, or otherwise process information for or about one or more industrial assets. In an example, a cloud computing system may include at least one processor circuit, at least one database, and a plurality of users or assets that may be in data communication with the cloud computing system. The cloud computing system may further include, or may be coupled with, one or more other processor circuits or modules configured to perform a specific task, such as to perform tasks related to asset maintenance, analytics, data storage, security, or some other function. Such cloud-based systems may be used in conjunction with the message queue-based systems described herein to provide widespread data communication with industrial assets, both new and old.

The flowcharts and/or block diagrams in the figures illustrate the architecture, functionality, and operation of possible implementations of systems, methods and computer program products according to various embodiments of the present invention. In this regard, each block in the flowcharts and/or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowcharts, and combinations of blocks in the block diagrams and/or flowcharts, can be implemented by special purpose hardware-based systems that perform the specified functions or acts, or combinations of special purpose hardware and computer instructions.

Those in the art will appreciate that various adaptations and modifications of the above-described embodiments can be configured without departing from the scope and spirit of the claims. Therefore, it is to be understood that the claims may be practiced other than as specifically described herein.

The invention claimed is:

1. A method for receiving and processing sensor data for an operating additive manufacturing machine, the method comprising:
receiving, at a first server, the sensor data from a sensor for the operating additive manufacturing machine;
determining, using a processor of the first server, values of the sensor data relative to time;
determining, using the processor of the first server, working tool positions relative to time based on process data which controls operation of the additive manufacturing machine, the process data comprising vectors defining the working tool positions during an additive manufacturing process;
determining the sensor data values at the working tool positions based on a correlation of the values of the sensor data relative to time and the working tool positions relative to time;
displaying, on a display of the user interface device, a representation of the sensor data values at the working tool positions;
segmenting, using the processor of the first server, the process data into the working vectors and non-working vectors; and
filtering, based on the working vectors, the tool positions relative to time to obtain the working tool positions relative to time.

2. The method of claim 1, further comprising correlating, using a processor of a user interface device, a structural model of the part with the sensor data values at the working tool positions, wherein the displaying comprises displaying at least a portion of the structural model in correspondence with the representation of the sensor data values at the working tool positions.

3. The method of claim 2, wherein the correlating of the structural model comprises correlating each of the working tool positions of the sensor data values with a closest element of the structural model.

4. The method of claim 2, wherein the displaying of the structural model comprises setting a color of each correlated element of the structural model in accordance with a determined color code to visually represent the respective sensor data value.

5. The method of claim 2, wherein the correlating of the structural model with the sensor data values comprises aligning the structural model with a point cloud formed by the sensor data values relative to the working tool positions.

6. The method of claim 5, wherein the display of the structural model comprises assigning a color to each point of the point cloud in accordance with a determined color code to visually represent the respective sensor data value; and displaying the point cloud superimposed on the structural model.

7. The method of claim 2, wherein the process data is arranged in layers and the displaying of the structural model in correspondence with the representation of the sensor data values at the working tool positions is done on a layer-by-layer basis.

8. The method of claim 1, wherein the receiving of the sensor data comprises sampling an output of the sensor to produce the sensor data.

9. The method of claim 1, wherein the tool comprises a laser and the sensor comprises a pyrometer configured to detect a surface temperature of the part at a point where a beam of the laser is impinging on the part.

10. The method of claim 1, further comprising compressing the sensor data and transmitting the sensor data via a network to a second server, the second server providing a web service to provide the sensor data to a user interface device.

11. A system for receiving and processing sensor data for an operating additive manufacturing machine, the system comprising:

a first server having a processor configured to perform:
  receiving the sensor data from a sensor for the operating additive machine;
  determining values of the sensor data relative to time;
  determining working tool positions relative to time based on process data which controls operation of the additive manufacturing machine, the process data comprising vectors defining the working tool positions during an additive manufacturing process; and
  determining the sensor data values at the working tool positions based on a correlation of the values of the sensor data relative to time and the working tool positions relative to time; and
a user interface device comprising a display and a processor configured to perform:
  displaying, on a display of the user interface device, a representation of the sensor data values at the working tool positions
wherein the processor of the first server is further configured to perform:
  segmenting the process data into the working vectors and non-working vectors; and
  filtering, based on the working vectors, the tool positions relative to time to obtain the working tool positions relative to time.

12. The system of claim 11, wherein the user interface device is further configured to perform correlating, using the processor of the user interface device, a structural model of the part with the sensor data values at the working tool positions, wherein the displaying performed by the user interface device comprises displaying at least a portion of the structural model in correspondence with the representation of the sensor data values at the working tool positions.

13. The system of claim 12, wherein the correlating of the structural model comprises correlating each of the working tool positions of the sensor data values with a closest element of the structural model.

14. The system of claim 12, wherein the displaying of the structural model comprises setting a color of each correlated element of the structural model in accordance with a determined color code to visually represent the respective sensor data value.

15. The system of claim 12, wherein the correlating of the structural model with the sensor data values comprises aligning the structural model with a point cloud formed by the sensor data values relative to the working tool positions.

16. The system of claim 15, wherein the display of the structural model comprises assigning a color to each point of the point cloud in accordance with a determined color code to visually represent the respective sensor data value; and displaying the point cloud superimposed on the structural model.

17. The system of claim 12, wherein the process data is arranged in layers and the displaying of the structural model in correspondence with the representation of the sensor data values at the working tool positions is done on a layer-by-layer basis.

18. The system of claim 11, further comprising an analog-to-digital converter configured to sample an output of the sensor to produce the sensor data.

19. The system of claim 11, wherein the tool comprises a laser and the sensor comprises a pyrometer configured to detect a surface temperature of the part at a point where a beam of the laser is impinging on the part.

20. The system of claim 11, further comprising a second server, wherein the processor of the first server further performs compressing the sensor data and transmitting the sensor data via a network to the second server, the second server providing a web service to provide the sensor data to the user interface device.

21. A method for receiving and processing sensor data for an operating additive manufacturing machine, the method comprising:
  receiving, at a first server, the sensor data from a sensor for the operating additive manufacturing machine;
  determining, using a processor of the first server, values of the sensor data relative to time;
  determining, using the processor of the first server, working tool positions relative to time based on process data which controls operation of the additive manufacturing machine, the process data comprising vectors defining the working tool positions during an additive manufacturing process;
  determining the sensor data values at the working tool positions based on a correlation of the values of the sensor data relative to time and the working tool positions relative to time;
  outputting the sensor data values at the working tool positions to an analytic model of the additive manufacturing machine;
  receiving, from the analytic model of the additive manufacturing machine, adjusted process data, the adjusted process data being determined based at least in part on the analytic model and the sensor data values at the working tool positions, the analytic model being based at least in part on a measured characteristic of the additive manufacturing machine; and
  using the adjusted process data to control the operation of the additive manufacturing machine;
  segmenting, using the processor of the first server, the process data into the working vectors and non-working vectors; and
  filtering, based on the working vectors, the tool positions relative to time to obtain the working tool positions relative to time.

* * * * *